United States Patent
Chu et al.

(10) Patent No.: US 6,309,968 B1
(45) Date of Patent: Oct. 30, 2001

(54) METHOD TO IMPROVE INTRINSIC REFRESH TIME AND DICHLOROSILANE FORMED GATE OXIDE RELIABILITY

(75) Inventors: Huey-Chi Chu, Taipei; Yeh-Sen Lin, Tao-Yuan, both of (TW)

(73) Assignee: Vanguard International Semiconductor Corporation, Hsin-chu (TW)

( * ) Notice: Subject to any disclaimer, the term of this patent is extended or adjusted under 35 U.S.C. 154(b) by 0 days.

(21) Appl. No.: 09/391,887

(22) Filed: Sep. 7, 1999

(51) Int. Cl.$^7$ .................................................. H01L 21/44
(52) U.S. Cl. ........................................... 438/660; 257/295
(58) Field of Search .................................... 438/256, 399, 438/597, 618, 620, 622, 624, 625, 626, 630, 631, 637, 638, 647, 651, 660; 257/295, 296

(56) References Cited

U.S. PATENT DOCUMENTS

| | | | |
|---|---|---|---|
| 4,151,007 | 4/1979 | Levinstein et al. | 148/1.5 |
| 5,210,056 | 5/1993 | Pong et al. | 437/239 |
| 5,492,845 | 2/1996 | Fujimaki | 437/40 |
| 6,010,933 | * 1/2000 | Cherng | 438/253 |
| 6,078,072 | * 6/2000 | Okudaira et al. | 257/295 |

OTHER PUBLICATIONS

Wolf et al., "Silicon Processing for the VLSI Era," vol. 1—Process Technology, Lattice Press, Sunset Beach, CA, 1986, pp. 221–223.

Wolf et al., "Silicon Processing for the VLSI Era," vol. 2—Process Integration, Lattice Press, Sunset Beach, CA, 1986, pp. 110–111.

* cited by examiner

Primary Examiner—David Nelms
Assistant Examiner—David Vu
(74) Attorney, Agent, or Firm—George O. Saile; Stephen B. Ackerman; Billy Knowles

(57) ABSTRACT

The intrinsic refresh time of a DRAM and the reliability of the gate oxide of the pass transistor of the memory cell of the DRAM is improved by a method to form electronic components of an integrated circuit on a semiconductor substrate that will eliminate damage to molecular bonds and reduce junction leakage within the semiconductor substrate. The method begins by forming said electronic components using recognized methods to create implantations, insulating oxide layers, selectively etching the insulating oxide layers and deposited conductive layers to assemble the transistors and capacitors of the integrated circuit. Interconnections between the electronic components are then formed. The interconnections include multiple layers of metal, multiple layers of heavily doped polycrystalline silicon, and silicon/metal alloys to connect terminals of said electronic components to the multiple layers of metals and multiple layers of heavily doped polycrystalline silicon. The molecular bonds are then repaired by sintering the semiconductor substrate in an atmosphere of atomic hydrogen ($H_2$) for a time and a temperature sufficient to repair damage to the molecular bonds within said semiconductor substrate so as to reduce said junction leakage of said transistors and to remove traps between the surface of the semiconductor substrate and the gate oxide of the transistors.

6 Claims, 4 Drawing Sheets

METHOD TO IMPROVE INTRINSIC REFRESH TIME AND DICHLOROSILANE FORMED GATE OXIDE RELIABILITY

BACKGROUND OF THE INVENTION

1. Field of the Invention

This invention is related to methods and processes for forming integrated circuits on a semiconductor substrate. More particularly, this invention to methods and processes for forming dynamic random access memory (DRAM) to improve intrinsic refresh time and dichlorosilane formed gate oxide within a DRAM.

2. Description of the Related Art

The structure and fabrication of DRAM is well known in the art and shown in FIG. 1. A field oxide 115 is formed on the surface of a semiconductor substrate 100. The field oxide 115 is etched to form openings for the electronic components that form the DRAM. A gate oxide 120 is formed within the opening. Heavily doped polycrystalline silicon is deposited on the gate oxide within the opening in the field oxide 115 to form the gate electrode 125. The drain region 105 and the source region 110 are formed by the implantation of dopant atoms into the surface of the semiconductor substrate 100 in the opening in the field oxide 115 adjacent to the gate electrode 125.

The gate oxide 120 is etched to form contact windows to the drain 105 and the source 110. A metal such as tungsten or titanium is deposited at the contact window of the source and alloyed with the silicon at the surface of the semiconductor substrate to form the source contact 150. The source contact is connected to the bit-line 155 of the DRAM. Generally, the bit-line 155 of the DRAM is formed of a heavily doped polycrystalline silicon.

The capacitor of the DRAM memory cell has a top plate 130 that is also formed of a heavily doped polycrystalline silicon. The top plate 130 of the capacitor is connected to the drain region by the drain contact 145. The drain contact 145 is formed by the deposition and alloying with the silicon of a metal such as tungsten (W) or titanium (Ti) in the contact window that was formed as described above.

An insulating material such as a silicon dioxide or silicon nitride is deposited on the top plate 130 to form the capacitor dielectric 140. The bottom plate 135 is formed by the deposition of a second layer of the heavily doped polycrystalline silicon. The bottom plate 135 is connected in common with the bottom plates of other memory cells and a reference power supply voltage source.

Layers of an interlayer dielectric serve to isolate the layers of the bit-lines 155, the bottom plate 135 and the first metal layer 165 and the second metal layer 170. The first and second metal layers 165 and 170 are formed by deposition of a metal such as aluminum on the surface of the interlayer dielectric 160. The interlayer via 175 connects the first and second metal layers 165 and 170. The first and second metal layers 165, 170 and the layers of polycrystalline silicon such as the bit-lines 155 form the interconnections of the electronic components to make up integrated circuits such as the DRAM.

During the etching of the gate oxide 120 to form the contact openings to the drain 105 and the source 110 of the pass transistor of the memory cell, the surface of the semiconductor substrate 100 becomes damaged forming a path for leakage current 180 from the drain region 105 into the semiconductor substrate 100. This leakage current decreases the time interval required for the intrinsic refresh of the DRAM memory cell.

To form the electrical contact for the bit-line to the gate 125 of the memory cell, a contact metal 190 is formed of an alloy of silicon and a metal such as tungsten. Dichlorosilane ($SiH_2CL_2$) is reacted with tungsten (W) to form the contact metal 190 as a tungsten silicide (WSi). During the reaction, chlorine ions ($CL_2$) penetrate the heavily doped polycrystalline silicon of the gate 125 and are trapped 180 at the interface of the gate oxide 120 and the semiconductor substrate 100. These trapped ions 180 decrease the reliability of the memory cell.

*Processing for the VLSI Era, Volume 2—Process Integration*, Wolf et al., Lattice Press, Sunset Beach, Calif. 1986, pp. 110–111 and quoted as follows describes sintering of contacts.

"The sintering or annealing of contacts (i.e., the alloying of contacts through treatment at an elevated temperature) is performed to allow any interface layer that exists between the metal and the Si to be consumed by a chemical reaction, and to allow the metal and Si to come into intimate contact through interdiffusion. The details of the various reactions that occur at specific metal-Si interfaces during the sinter cycle are described in the following sections examining the properties of each contact type. In this section we merely mention the several methods by which such intermixing of materials at the interface is performed."

"The traditional method carries out the sinter step in a diffusion furnace, usually at 400–500° C. for 10 to 30 minutes in the presence of $H_2$ or a forming gas [a mixture of $H_2$ (5–10 at %) and $N_2$ (95–90 at %)]. Such gases are used because many metals are sensitive to oxygen at elevated temperatures, and because this step is also used to anneal out the surface states (i.e., interface traps at the oxide-Si interface) by tying up the dangling Si and oxygen bonds. The hydrogen is responsible for passivating and deactivating the interface traps."

Further *Processing for the VLSI Era, Volume 1—Process Technology*, Wolf et al., Lattice Press, Sunset Beach, Calif. 1986, pp. 221–223 describes as quoted below the properties of $Si/SiO_2$ interface and oxide traps.

"The interface trap charge, $Q_{it}$ refers to charge which is localized at the $Si/SiO_2$ interface on sites that can change their charge state by exchange of mobile carriers (electrons or holes) with the silicon. The charge state of the interface trap site changes with gate bias if the interface trap is moved past the Fermi level, causing its occupancy to change. These traps have energy levels distributed through out the silicon bandgap with a U-shaped distribution across the bandgap. The minimum level at midgap is typically the concentration level used to characterize their presence. The density of these charges is expressed as the number/$cm^2 eV$."

Further, quoting from Wolf.

"In the low temperature post-metalization case, the sample is annealed in $H_2$ or other non-oxidizing ambients, such as forming gas ($H_2$—$N_2$) or Ar, in the temperature range of 350–500° C. for up to 30 min. Aluminum must be present for the anneal to be effective. Before such an anneal, a steam grown oxide may exhibit $Q_{it}$ densities in the low $10^{11}$ $cm^{-2} eV^{-1}$ range, while after anneal, the densities are decreased to the low $10^{10}$ $cm^{-2}$ $eV^{-1}$ regime. This is an acceptable level for most device applications. It is believed that water in $SiO_2$, present even in dry oxides, reacts with the aluminum to form $Al_2O_3$ and atomic hydrogen (H). The H diffuses to the $Si/SiO_2$ interface, where it reacts chemically with traps, rendering them electrically inactive. If silicon nitride is present, it serves to block the diffusion of atomic $H_1$ and no reduction in $Q_{it}$ is observed. Thus postmetalization anneals should be performed prior to passivation, if Si₃N₄ is used as the passivating overcoat."

"In the case of the post oxidation high temperature anneal, the oxide is grown and then annealed at the growth temperature (in situ) in an H$_2$ or an inert ambient (N$_2$ or Ar). In this case, the reduction in Q$_{it}$ probably results from H$_2$ or trace quantities of H$_2$O in the ambient, again promoting the reaction leading to atomic hydrogen."

U.S. Pat. No. 4,151,007 (Levinstein et al.) describes adding a hydrogen heating (annealing) step to a MOS fabrication process at a point in the process after the last step that is to be performed at 600° C. or higher has been completed. The temperature at which hydrogen anneal step of the present invention is carried out is 650° C.≦950° C.

The inclusion of the hydrogen anneal step of Levinstein et al. significantly increases the stability of MOS structures by limiting variations voltage and the threshold voltage during use of the structures. The hydrogen anneal step of Levinstein et al. mitigates the effects of slow trapping and thus improving the stability of MOS structures.

U.S. Pat. No. 5,492,845 (Fujimaki) teaches a method of manufacturing a MOS device. An electrode film of polycrystalline silicon is deposited on a gate oxide film. A dopant such as phosphorus is deposited on the surface of the electrode film. Multiple heat treating steps are carried out to drive in the dopant into the surface of the electrode film. At least one of the heat treating steps is carried out in a hydrogen atmosphere at a temperature of from 800° C. to 1100° C. for a time of less than four hours. The electrode film then has a photoresist deposited on it. The photoresist is patterned and the polysilicon is etched. The resultant MOS devices have improved time dependent dielectric breakdown characteristics and improved time-zero dielectric breakdown characteristics.

U.S. Pat. No. 5,210,056 (Pong et al.) describes a method to fabricate a semiconductor device. Particularly the method defines the process of forming a gate oxide film of the semiconductor device. The semiconductor substrate is first annealed in an atmosphere of nitrogen (N$_2$). The gate oxide is then formed by wet oxidizing the annealed semiconductor substrate at a low temperature in a mixed gas atmosphere of oxygen (O$_2$) and hydrogen (H$_2$). A second annealing is performed where the gate oxide is formed. The second annealing is in an atmosphere of nitrogen (N$_2$) at a high temperature (820° C.–950° C.) for a period and then at a lower temperature (650° C.). This method decreases the thinning of the gate oxide near the field oxide. Any instability of the flat band voltage (V$_{FB}$) is considerably recovered. The field concentration phenomenon is decreased and tolerance to dielectric breakdown is increased.

SUMMARY OF THE INVENTION

An object of this invention is to improve the intrinsic refresh time of a DRAM.

Another object of this invention is to improve the reliability of the gate oxide of the pass transistor of the memory cell of the DRAM.

To accomplish these and other objects a method to form electronic components of an integrated circuit on a semiconductor substrate will eliminate damage to molecular bonds and reduce junction leakage within the semiconductor substrate The method begins by forming the electronic components using recognized methods to create implantations, insulating oxide layers, selectively etching the insulating oxide layers and deposited conductive layers to assemble the transistors and capacitors of the integrated circuit. Interconnections between the electronic components are then formed. The interconnections include multiple layers of metal, multiple layers of heavily doped polycrystalline silicon, and silicon/metal alloys to connect terminals of the electronic components to the multiple layers of metals and multiple layers of heavily doped polycrystalline silicon. The molecular bonds are then repaired by sintering the semiconductor substrate in an atmosphere of atomic hydrogen (H$_2$) for a time and a temperature sufficient to repair damage to the molecular bonds within the semiconductor substrate so as to reduce the junction leakage of the transistors and to remove traps between the surface of the semiconductor substrate and the gate oxide of the transistors.

The sintering in the atomic hydrogen (H$_2$) is temperature is from approximately 400° C. to approximately 460° C. and for a time is from approximately 20 min to approximately 40 min.

DETAILED DESCRIPTION OF THE INVENTION

Figure 1:
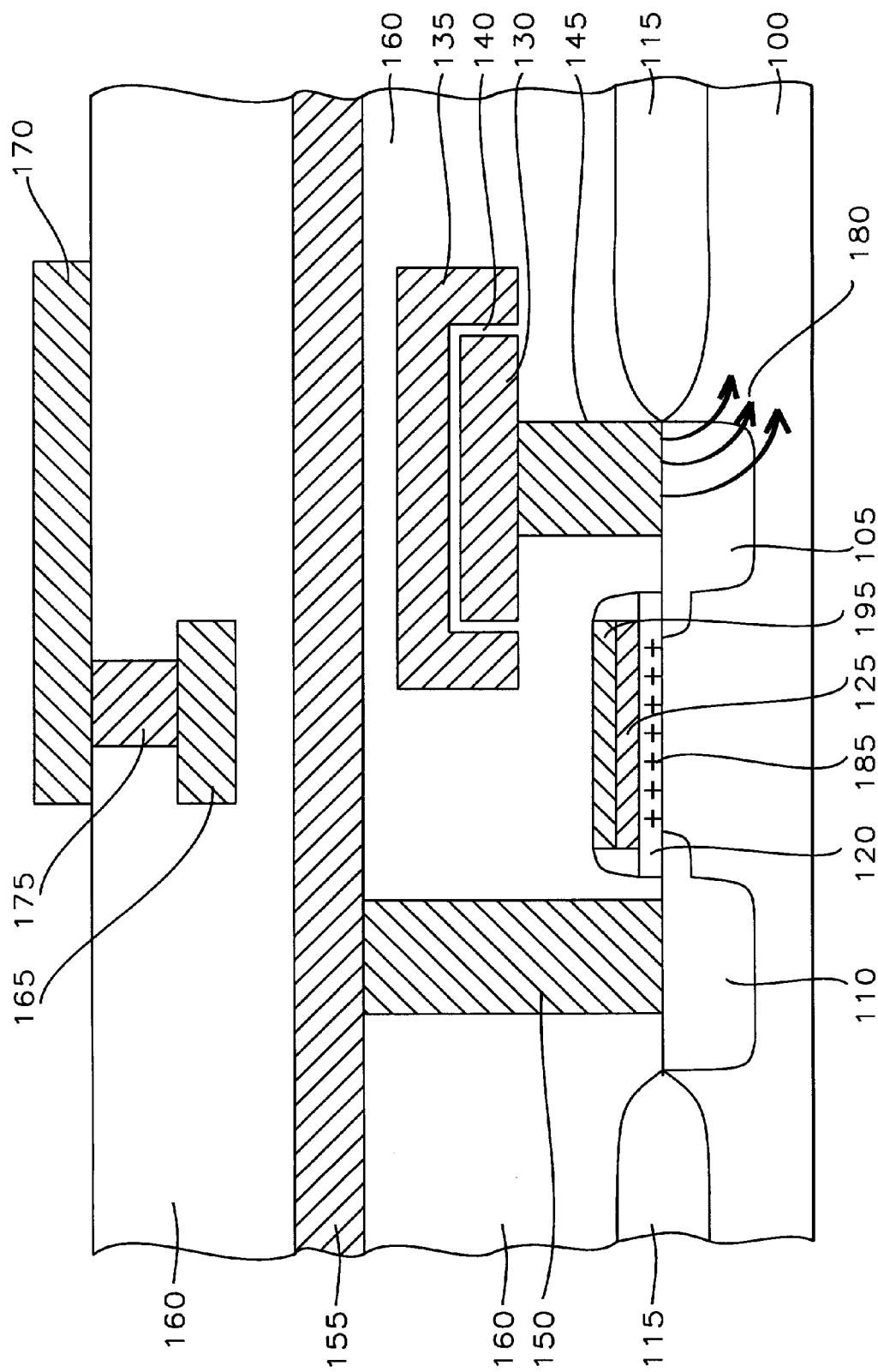
FIG. 1 is a cross-sectional diagram of a memory cell of a DRAM of the prior art.
Figure 2:
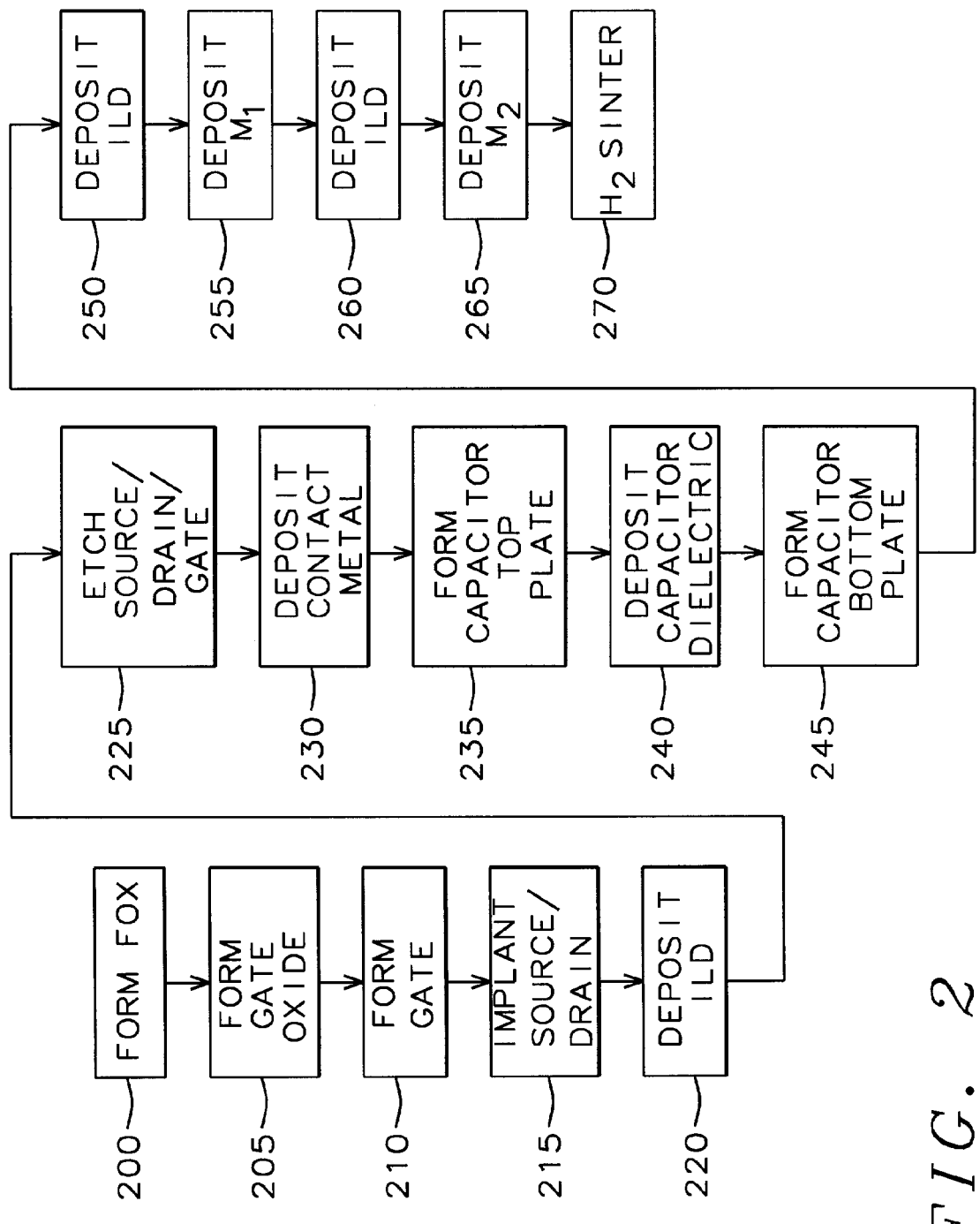
FIG. 2 is a process flow diagram of the formation of a memory cell of a DRAM of this invention.

FIG. 2 is a process flow diagram of a method to form a memory cell of a DRAM of this invention. The method of this invention will eliminate the trapped ions 180 of FIG. 1 and the damage caused to the surface of the semiconductor substrate 100 during the etching of the gate oxide 120. The elimination of the damage reduces the leakage current 180.

A field oxide is formed 200 on the surface of a cleaned and polished semiconductor substrate. Openings in the field oxide are etched defining the memory cells of the DRAM. Within the openings, the gate oxide is formed 205 and a layer of polycrystalline silicon is deposited on the surface of the gate oxide. The layer of polycrystalline silicon is heavily doped to improve its conductivity. Metallic tungsten (W) is reacted with dichlorosilane (SiH$_2$CL$_2$) to form a tungsten silicide (WSi). The layer of tungsten silicide (WSi) and the layer of heavily doped polycrystalline silicon are etched to form 210 the gate of the pass transistor of the memory cell of the DRAM.

The sources and drains of the pass transistors of the memory cell are implanted 215 on each side of the gate. An interlayer dielectric is deposited 220 on the surface of the semiconductor substrate. The interlayer dielectric and the gate oxide are etched 225 in the areas of the sources and drains. A contact metal such as Tungsten (W) or Titanium (Ti) is deposited 230 in the areas of the sources and drains.

The top plate of the cell capacitor is formed 235 by depositing a heavily doped polycrystalline silicon to contact to the contact metal deposited 230 on the drain of the pass transistor. The dielectric of the cell capacitor is deposited 240 on the top plate. A second layer of heavily doped polycrystalline silicon is deposited on the dielectric of the cell capacitor to form 245 the bottom plate of the cell capacitor. The bottom plate of the cell capacitor is interconnected with the bottom plates of other cell capacitors of the DRAM array and connected to a reference voltage source.

A second interlayer dielectric is deposited 250 on the surface of the semiconductor substrate. Openings are etched in the interlayer dielectric to form connections to electronic circuits of the DRAM. A first level of a metal such as aluminum is deposited 255 to interconnect the electronic circuits.

A third layer of interlayer dielectric is deposited 260 on the surface of the semiconductor substrate. Again, openings are etched in the third layer of interlayer dielectric and a second layer of the metal such as aluminum is deposited 265 to complete the interconnection of the electronic circuits of the DRAM.

Additional layers of interlayer dielectric and layers of metal as well as layers of heavily doped polycrystalline silicon may be added to the process for added interconnections of the electronic components of the DRAM. After all layers have been formed on the surface of the semiconductor substrate, the semiconductor substrate is placed in an atmosphere of atomic hydrogen ($H_2$). The semiconductor substrate is brought to a temperature of from approximately 400° C. to approximately 460° C., preferably 410° C. for a period of from approximately 20 minutes to approximately 40 minutes, preferably 30 minutes. This sintering 270 of the semiconductor substrate repairs the dangling bonds at the interface of the semiconductor substrate and gate oxide as well as the damage to the semiconductor interface that occurs at the etching 225 of the contact openings for the source and drain.

Figure 3:
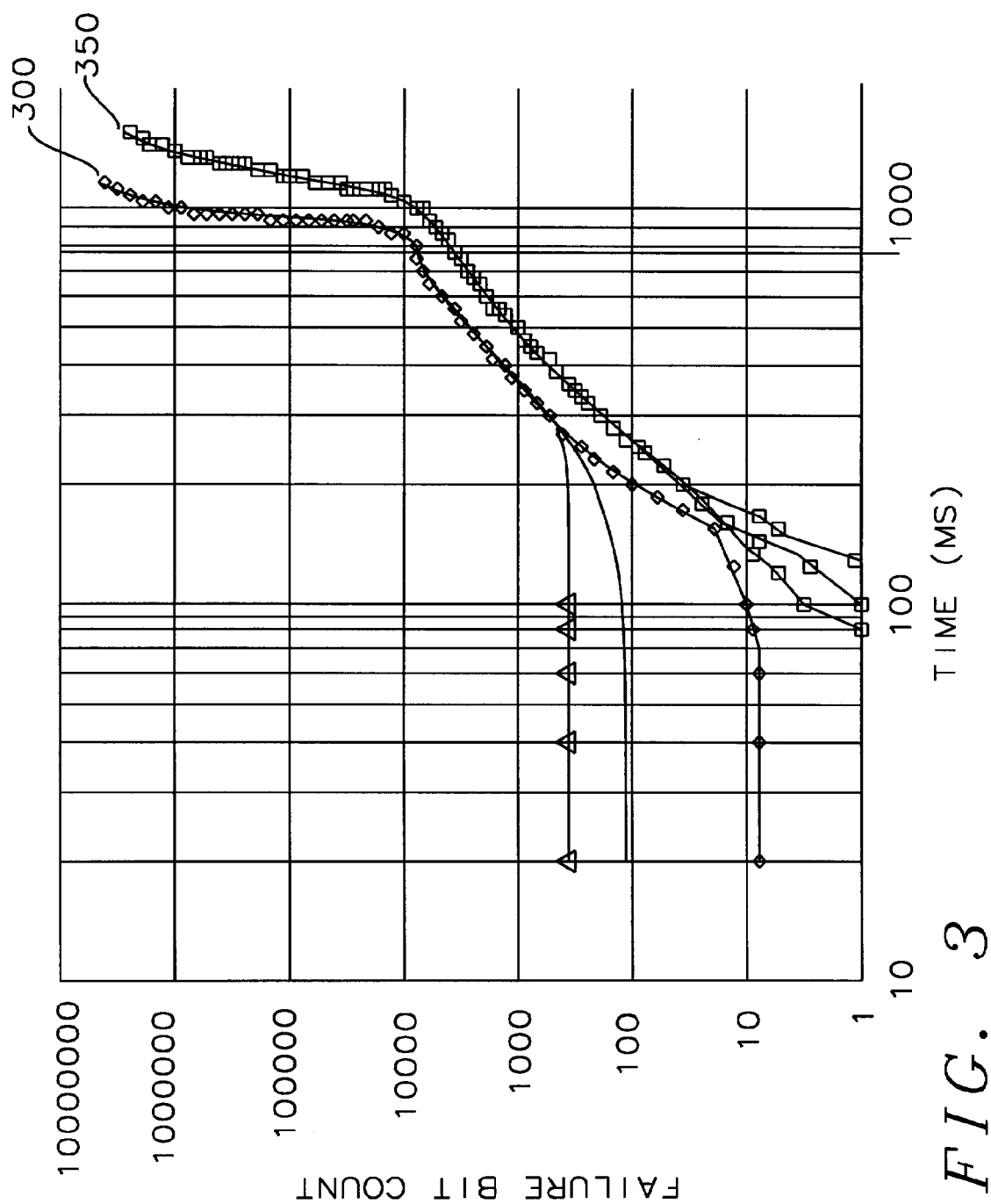
FIG. 3 is a plot of the failure bit count versus intrinsic refresh time of the DRAM of this invention compared to the DRAM of the prior art.

FIG. 3 is a plot of the failure bit count of a DRAM of the prior art 300 and the DRAM of this invention 350 versus the intrinsic refresh time. It is apparent that the failure bit count of the DRAM of the prior art 300 is more than one order of magnitude greater than the failure bit count of the DRAM of this invention 350.

The sintering step 270 of FIG. 2 of this invention repairs the molecular bonds at the drain of the pass transistor. This reduces the leakage current from the top plate of the cell capacitor. The reduced leakage current allows a longer time between refresh operations of the DRAM as shown.

Figure 4:
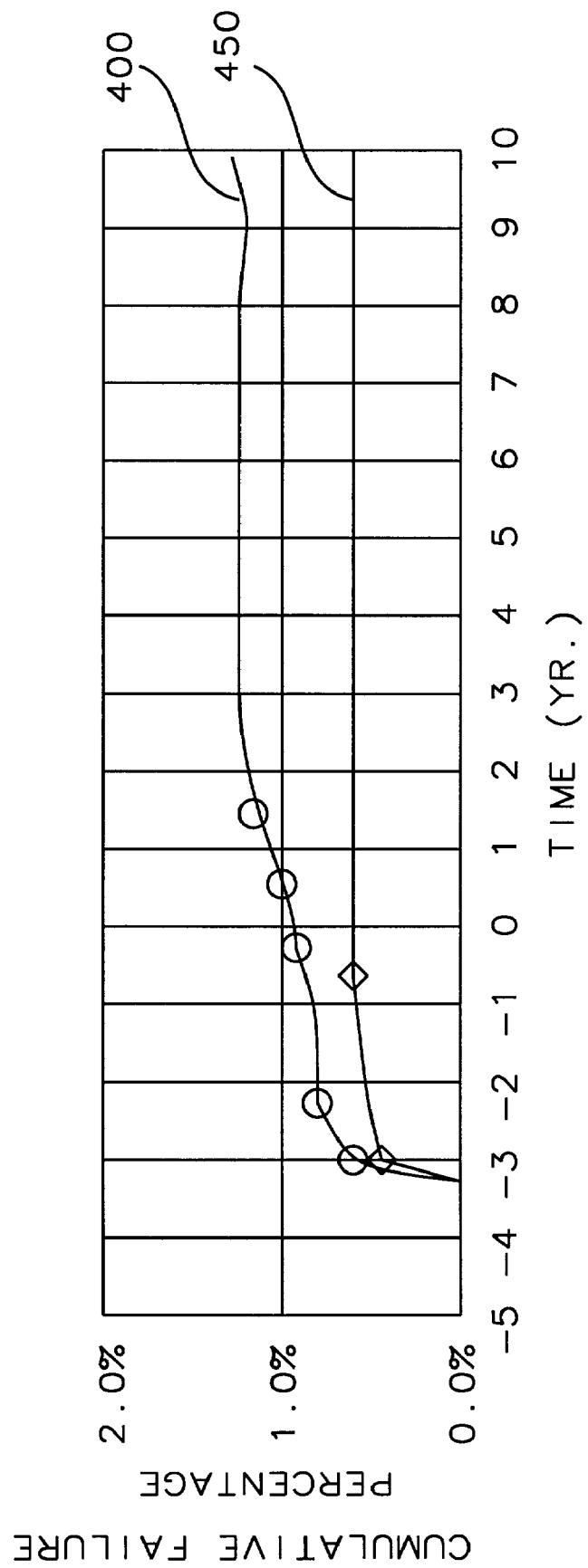
FIG. 4 is a plot of the cumulative failures versus time of the DRAM of this invention as compared to the DRAM of the prior art.

FIG. 4 is a plot of the cumulative failures of the DRAM of the prior art 400 and the DRAM of this invention 450 versus time. The DRAM of the prior art 400 as shown has a higher number of failures. Generally, one of the failures of the gate oxide is due to traps at the interface of the gate oxide and the silicon substrate. Thus the sintering step 270 of FIG. 2 of this invention eliminates the traps and improves the failure rate.

While this invention has been particularly shown and described with reference to the preferred embodiments thereof, it will be understood by those skilled in the art that various changes in form and details may be made without departing from the spirit and scope of the invention.

The invention claimed is:

1. A method to form electronic components of an integrated circuit on a substrate to eliminate damage to molecular bonds and reduce junction leakage within said substrate, comprising the steps of:

forming said electronic components which include transistors and capacitors;

forming interconnections between said electronic circuit, whereby said interconnections include multiple layers of metal, multiple layers of heavily doped polycrystalline silicon, and silicon/metal alloys to connect terminals of said electronic components to the multiple layers of metals and multiple layers of heavily doped polycrystalline silicon; and sintering said substrate in an atmosphere of atomic hydrogen ($H_2$) for a time and a temperature sufficient to repair damage to molecular bonds within said substrate and to reduce said junction leakage of said transistors.

2. The method of claim 1 wherein the temperature is from approximately 400° C. to approximately 460° C.

3. The method of claim 1 wherein the time is from approximately 20 min to approximately 40 min.

4. A method for forming a dynamic random access memory on a substrate to improve intrinsic refresh time and gate oxide reliability by repairing damaged molecular bonds at a surface of the substrate, comprising the steps of:

forming electronic components memory cells and address, data, and control circuitry of said dynamic random access memory on said substrate, whereby said memory cells include a pass transistor having said gate oxide and a capacitor having a top plate connected to a drain of said pass transistor;

forming interconnections between said electronic components, whereby said interconnections include multiple layers of metal, multiple layers of a heavily doped polycrystalline silicon, and an alloy of metal and silicon to join the terminals of the electronic components to the multiple layers of metal and multiple layers of heavily doped polycrystalline silicon; and sintering said substrate in an atmosphere of atomic hydrogen ($H_2$) for a time and a temperature sufficient to repair damage to said molecular bonds.

5. The method of claim 4 wherein the temperature is from approximately 400° C. to approximately 460° C.

6. The method of claim 4 wherein the time is from approximately 20 min to approximately 40 min.

* * * * *